US009691647B2

(12) United States Patent
Wang et al.

(10) Patent No.: US 9,691,647 B2
(45) Date of Patent: Jun. 27, 2017

(54) HOLDING APPARATUS FOR HOLDING SUBSTRATES

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Peng Wang, Beijing (CN); Jiangtao Zhang, Beijing (CN); Dongdong Xu, Beijing (CN); Xiang Guo, Beijing (CN)

(73) Assignees: BOE TECHNOLOGY GROUP CO., LTD. (CN); HEFEI BOE OPTOELECTRONICS TECHNOLOGY CO., LTD. (CN)

(*) Notice: Subject to any disclaimer, the term of this patent is extended or adjusted under 35 U.S.C. 154(b) by 0 days.

(21) Appl. No.: 15/135,882

(22) Filed: Apr. 22, 2016

(65) Prior Publication Data
US 2016/0347542 A1    Dec. 1, 2016

(30) Foreign Application Priority Data

May 28, 2015 (CN) .......................... 2015 1 0283815

(51) Int. Cl.
*H01L 21/673* (2006.01)
(52) U.S. Cl.
CPC .... *H01L 21/6734* (2013.01); *H01L 21/67309* (2013.01)
(58) Field of Classification Search
CPC ........ A47B 45/00; A47B 81/00; B65D 85/48; B65D 85/30; H01L 21/6734; H01L 21/67309

USPC .......... 211/41.17, 1.51, 41.1, 1.57, 189, 194, 211/41.18, 41.12, 41.14, 41.15; 206/708, 206/710, 453, 454

See application file for complete search history.

(56) References Cited

U.S. PATENT DOCUMENTS

| 4,761,044 A | * | 8/1988 | Akama ................ H05K 7/1418 312/110 |
| 4,899,891 A | * | 2/1990 | Sipila .................. B65G 49/062 206/448 |
| 6,098,808 A | * | 8/2000 | Matsuda ............ H05K 13/0069 206/708 |
| 6,155,426 A | * | 12/2000 | Matsuda ............ H05K 13/0069 206/707 |

(Continued)

*Primary Examiner* — Daniel J Troy
*Assistant Examiner* — Hiwot Tefera
(74) *Attorney, Agent, or Firm* — Brooks Kushman P.C.

(57) ABSTRACT

The present disclosure relates to a holding apparatus for holding substrates, comprising: a case, and a first support rod and a second support rod, the first support rod is provided with first support sub-rods, and the second support rod is provided with second support sub-rods, the holding apparatus further comprising: a first adjusting mechanism configured to control the first support sub-rods at a first position to move in a direction perpendicular to the first support rod, so as to adjust gaps between the first support sub-rods and the second support sub-rods at a second position corresponding to the first position, and/or a second adjusting mechanism configured to control the second support sub-rods at the second position to move in a direction perpendicular to the second support rod, so as to adjust gaps between the second support sub-rods and the first support sub-rods at the first position.

19 Claims, 4 Drawing Sheets

(56) References Cited

U.S. PATENT DOCUMENTS

| | | | |
|---|---|---|---|
| 6,749,072 B2* | 6/2004 | Takano | H05K 7/1424 |
| | | | 211/175 |
| 7,246,708 B2* | 7/2007 | Chuang | A47B 57/10 |
| | | | 211/41.18 |
| 8,905,239 B2* | 12/2014 | Kim | H01L 21/6735 |
| | | | 206/454 |
| 2003/0132176 A1* | 7/2003 | Takano | H01L 21/6734 |
| | | | 211/41.1 |
| 2006/0226094 A1* | 10/2006 | Cho | B65D 85/48 |
| | | | 211/41.18 |
| 2008/0258587 A1* | 10/2008 | Mayuzumi | B65D 21/08 |
| | | | 312/111 |
| 2014/0326686 A1* | 11/2014 | Li | B65D 85/48 |
| | | | 211/41.1 |
| 2016/0300740 A1* | 10/2016 | Xu | H01L 21/67259 |

* cited by examiner

HOLDING APPARATUS FOR HOLDING SUBSTRATES

CROSS-REFERENCE TO RELATED APPLICATION

The present application claims priority to Chinese Patent Application No. 201510283815.X filed on May 28, 2015, which is incorporated herein by reference in its entirety.

TECHNICAL FIELD

The present disclosure relates to the field of display manufacturing, in particular to a holding apparatus for holding substrates.

BACKGROUND

Cassette for loading glass substrates in existing flat panel industry needs to be provided with pins (support rods) on both sides for supporting the glass substrates, so as to control the sagging amount thereof. Conventional pins are fixed.

With the thinning of glass substrates, control on the sagging amount is especially important. If the pins are designed too short, the substrate will excessively sag, failing to be stored. If the pins are designed too long, they will interfere with the fork of the robot, as a result, the fork can't be designed too wide.

SUMMARY

For solving the above-described problem, the present disclosure provides a holding apparatus for holding substrates to prevent the substrate from sagging and avoid occurrence of interference with a robot's fork which is used for picking and placing the substrate.

In order to achieve the above-described object, the technical solution adopted in the present disclosure is a holding apparatus for holding substrates, comprising: a case, and a first support rod and a second support rod which are located on two opposite sides in the case, wherein the first support rod is provided with a plurality of first support sub-rods, and the second support rod is provided with a plurality of second support sub-rods of numbers and at positions corresponding to the first support sub-rods, the first support sub-rods and the second support sub-rods are arranged opposite to each other so as to support the substrates. The holding apparatus for holding substrates further comprises a first adjusting mechanism provided on one side of the first support rod away from the second support rod and configured to control the first support sub-rods of the first support rod at a first position to move in a direction perpendicular to the first support rod, so as to adjust gaps between the first support sub-rods and the second support sub-rods of the second support rod at a second position, wherein the first position corresponds to the second position.

Further, the holding apparatus for holding substrates further comprises a second adjusting mechanism provided on one side of the second support rod away from the first support rod and configured to control the second support sub-rods of the second support rod at the second position to move in a direction perpendicular to the second support rod, so as to adjust gaps between the second support sub-rods and the first support sub-rods of the first support rod at the first position.

Further, the first adjusting mechanism comprises:
a first connector configured to drive the first support sub-rod at the first position to move through magnetic action;
a first moving mechanism configured to control the first connector to move in a direction parallel to the first support rod, so that a position of the first connector corresponds to that of the first support sub-rod at the first position; and
a second moving mechanism configured to control the first connector to move in a direction perpendicular to the first support rod, so as to drive the first support sub-rod connected to the first connector to move in a direction perpendicular to the first support rod.

Further, the first connector comprises a first bar-shaped connecting portion provided parallel to the first support rod, the first bar-shaped connecting portion is divided into a first portion having first magnetic polarity and a second portion having second magnetic polarity from one end to the other, and the first magnetic polarity and the second magnetic polarity repel each other. One end of the first support sub-rod near the first support rod comprises a second bar-shaped connecting portion provided parallel to the first support rod, the second bar-shaped connecting portion is divided into a third portion having the second magnetic polarity and a fourth portion having the first magnetic polarity from one end to the other. Under the control of the second moving mechanism, the first support sub-rod at the first position is moved away from the second support rod, while a position of the first portion corresponds to that of the third portion, and a position of the second portion corresponds to that of the fourth portion. Under the control of the second moving mechanism, the first support sub-rod at the first position is moved toward the second support rod, while the position of the first portion corresponds to that of the fourth portion, and the position of the second portion corresponds to that of the third portion.

Further, when the first support sub-rod at the first position is moved toward or away from the second support rod, a distance between the first bar-shaped connecting portion and the second bar-shaped connecting portion is a first preset distance.

Further, the first moving mechanism comprises:
a first screw rod connected to the first support rod, wherein the first screw rod is provided parallel to the first support rod, and the first connector is provided on the first screw rod; and
a first driving mechanism provided on one end of the first support rod, the first driving mechanism is configured to drive the first screw rod to rotate so as to drive the first connector to move along a direction parallel to the first support rod.

Further, the first driving mechanism is a servo motor, and the first screw rod is a ball screw rod.

Further, the ball screw rod comprises a screw shaft provided with a spiral ball screw groove on its external surface. The first connector comprises the first bar-shaped connecting portion and a nut connected therewith, the nut has a spiral ball screw groove on its inner circumferential surface which is provided opposite to the ball screw groove of the screw shaft, the nut is sleeved onto the screw shaft, a ball track formed of the ball screw groove of the nut and the ball screw groove of the screw shaft is provided with a ball, and the ball is capable of rolling in the ball track.

Further, the second moving mechanism comprises a second driving mechanism connected to the first screw rod, and the second driving mechanism is configured to drive the first screw rod to move along a direction perpendicular to the first support rod so as to drive the first connector to move along a direction perpendicular to the first support rod.

Further, the second driving mechanism is an air cylinder.

Further, the second adjusting mechanism comprises:
a second connector driving the second support sub-rod at the second position to move through magnetic action;
a third moving mechanism configured to control the second connector to move in a direction parallel to the second support rod so as to choose the second support sub-rod at the second position; and
a fourth moving mechanism configured to control the second connector to move in a direction perpendicular to the second support rod so as to drive the second support sub-rod connected to the second connector to move in a direction perpendicular to the second support rod.

Further, the second connector comprises a third bar-shaped connecting portion provided parallel to the second support rod, the third bar-shaped connecting portion is divided into a fifth portion having third magnetic polarity and a sixth portion having fourth magnetic polarity from one end to the other, the third magnetic polarity and the fourth magnetic polarity repel each other. One end of the second support sub-rod near the second support rod comprises a fourth bar-shaped connecting portion provided parallel to the second support rod, the fourth bar-shaped connecting portion is divided into a seventh portion having the fourth magnetic polarity and an eighth portion having the third magnetic pole portion. Under the control of the fourth moving mechanism, the second support sub-rod at the second position is moved away from the first support rod, while a position of the fifth portion corresponds to that of the seventh portion, and a position of the sixth portion corresponds to that of the eighth portion. Under the control of the fourth moving mechanism, the second support sub-rod at the second position is moved toward the first support rod, while the position of the fifth portion corresponds to that of the eighth portion, or the position of the sixth portion corresponds to that of the seventh portion.

Further, when the second support sub-rod at the second position is moved toward or away from the first support rod, a distance between the third bar-shaped connecting portion and the fourth bar-shaped connecting portion is a second preset distance.

Further, the third moving mechanism comprises:
a second screw rod connected to the second support rod, wherein the second screw rod is provided parallel to the second support rod, and the second connector is provided on the second screw rod; and
a third driving mechanism provided on one end of the second support rod, wherein the third driving mechanism is configured to drive the second screw rod to rotate so as to drive the second connector to move along a direction parallel to the second support rod.

Further, the third driving mechanism is a servo motor.

Further, the fourth moving mechanism comprises a fourth driving mechanism connected to the second screw rod, and the fourth driving mechanism is configured to drive the second screw rod to move along a direction perpendicular to the second support rod so as to drive the second connector to move along a direction perpendicular to the second support rod.

Further, the fourth driving mechanism is an air cylinder.

Further, the first support sub-comprises thereon a first region for supporting the substrates, the first region is tapered, and one end of the first region near the first support rod has an area greater than that of the other end of the first region away from the first support rod.

Further, the second support sub-rod comprises thereon a second region for supporting the substrates, the second region is tapered, and one end of the second region near the second support rod has an area greater than that of the other end of the second region away from the second support rod.

Further, one end of the first support sub-rod near the second support rod is provided with a guide wheel, and one end of the second support sub-rod near the first support rod is provided with a guide wheel.

The advantageous effects of the present disclosure is that with the configuration of the movable first support sub-rods and second support sub-rods, positions thereof can be adjusted dynamically when a robot picks and places a glass substrate, so as to avoid interference and take a good effect of supporting the substrate.

DETAILED DESCRIPTION

The features and principle of the present disclosure will be described hereinafter in details in conjunction with the drawings. The examples given below are only for explaining the present disclosure, and not intended to limit the scope thereof.

Figure 1:
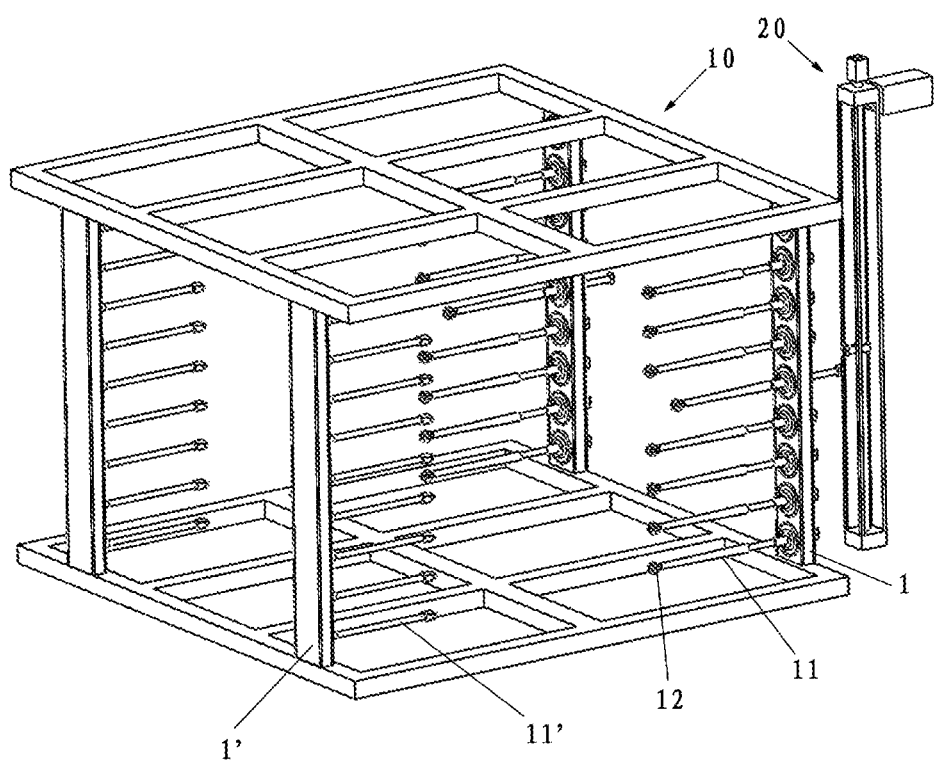
FIG. 1 is a schematic view showing the overall structure of a holding apparatus according to an embodiment of the present disclosure.
Figure 2:
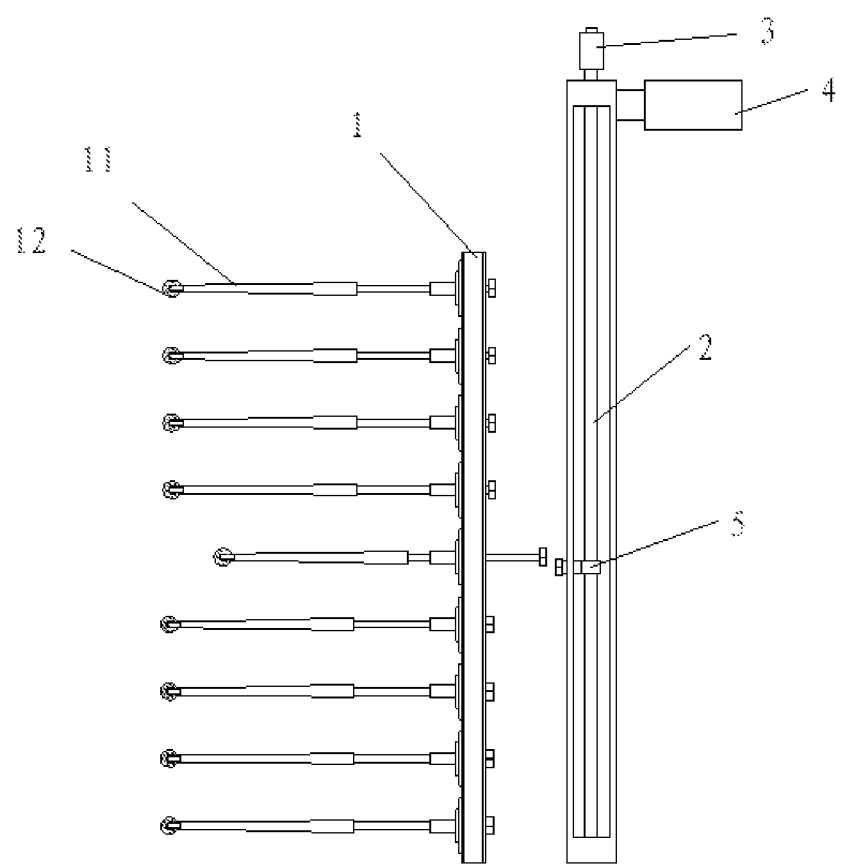
FIG. 2 is a schematic view showing the partial structure of a holding apparatus according to an embodiment of the present disclosure.
Figure 3:
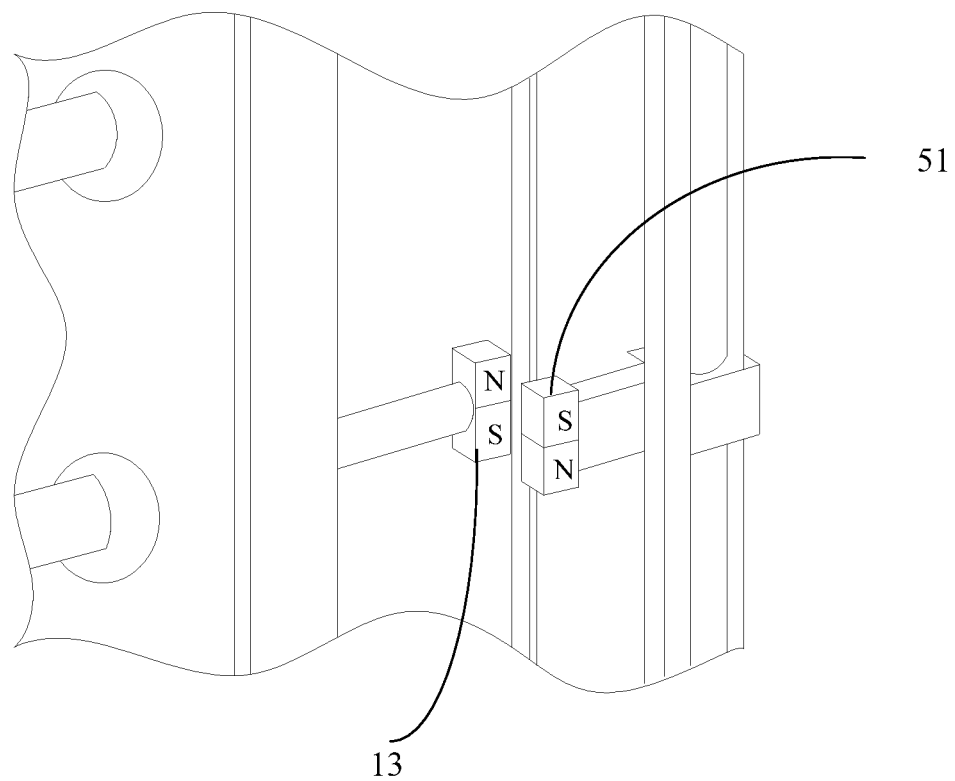
FIG. 3 is a schematic partially enlarged view showing a holding apparatus according to an embodiment of the present disclosure.

As shown in FIGS. 1-3, an example provides a holding apparatus for holding substrates, comprising: a case 10, and a first support rod 1 and a second support rod 1' which are located on two opposite sides in the case 10, wherein the first support rod 1 is provided with a plurality of first support sub-rods 11, and the second support rod 1' is provided with a plurality of second support sub-rods 11' of numbers and at positions corresponding to the first support sub-rods 11, the first support sub-rods 11 and the second support sub-rods 11' are arranged opposite to each other so as to support the substrates. The holding apparatus further comprises:
a first adjusting mechanism 20 provided on one side of the first support rod 1 away from the second support rod 1' and configured to control the first support sub-rods 11 of the first support rod 1 at a first position to move in a direction perpendicular to the first support rod 1, so as to adjust gaps between the first support sub-rods 11 and the second support sub-rods 11' of the second support rod 1' at a second position; and/or a second adjusting mechanism provided on one side of the second support rod 1' away from the first support rod 1 and configured to control the second support sub-rods 11' of the second support rod 1' at the second position to move in a direction perpendicular to the second support rod 1', so as to adjust gaps between the second support sub-rods 11' and the first support sub-rods 11 of the first support rod 1 at the first position.

Wherein the first position corresponds to the second position.

The first support sub-rods 11 at the first position and the second support sub-rods 11' at the second position are in cooperation with each other to support glass substrates. At this moment, in order to prevent the substrates from sagging excessively, the gaps between the first support sub-rods 11 at the first position and the second support sub-rods 11' at the second position have to be reduced so as to control the sagging amount of the substrates. The control on the sagging amount of the substrates may be realized by controlling the first support sub-rods 11 at the first position to move toward the second support sub-rods 11' at the second position, or by controlling the second support sub-rods 11' at the second position to move toward the first support sub-rods 11, or by controlling the first support sub-rods 11 at the first position and the second support sub-rods 11' at the second position to move oppositely.

When there is a need to pick up the glass substrates located on the first support sub-rods 11 at the first position and the second support sub-rods 11' at the second position, the first support sub-rods 11 at the first position are controlled to move away from the second support sub-rods 11' at the second position, or the second support sub-rods 11' at the second position are controlled to move away from the first support sub-rods 11 at the first position, or the first support sub-rods 11 at the first position and the second support sub-rods 11' at the second position are controlled to move oppositely, so as to increase the gaps between the first support sub-rods 11 at the first position and the second support sub-rods 11' at the second position and avoid the interference between the robot's fork and the first support sub-rod 11 or the second support sub-rod 11'.

With the configuration of the movable first support sub-rods 11 and/or second support sub-rods 11', positions thereof can be adjusted dynamically when a robot picks and places a glass substrate, so as to avoid interference and take a good effect of supporting the substrate.

As shown in FIGS. 1-2, in this example, the first support rod 1 is provided with a plurality of the first support sub-rods 11. Correspondingly, the second support rod 1' is provided with a plurality of the second support sub-rods 11' corresponding to the first support sub-rods 11 in positions and numbers. Each pair of the first support sub-rod 11 and the second support sub-rod 11', which correspond with each other in position, are in cooperation with each other to support a glass substrate. When there is a need to pick and place a glass substrate, it is necessary to adjust the gap between the first support sub-rod 11 and the second support sub-rod 11' which are supporting the glass substrate, so as to achieve the object of avoiding the interference with the robot's fork used for picking and placing the glass substrate, and taking a good effect of supporting the same. Now, the first support sub-rod 11 for holding the glass substrate is the first support sub-rod 11 at the first position, and correspondingly, the second support sub-rod 11' for holding the glass substrate is the second support sub-rod 11' at the second position.

The first adjusting mechanism 20 may have a variety of specific structural forms, as long as the first support sub-rod 1' of the first support rod 1 at the first position can be controlled to move in the direction perpendicular to the first support rod 1. In this example, the first adjusting mechanism 20 comprises:

a first connector 5 configured to drive the first support sub-rod 11 at the first position to move through magnetic action;

a first moving mechanism configured to control the first connector 5 to move in a direction parallel to the first support rod 1, so that a position of the first connector 5 corresponds to that of the first support sub-rod 11 at the first position; and a second moving mechanism configured to control the first connector 5 to move in a direction perpendicular to the first support rod 1 so as to drive the first support sub-rod 11 connected to the first connector 5 to move in a direction perpendicular to the first support rod 1.

The first connector 5 is controlled by the first moving mechanism to move in the direction parallel to the first support rod 1, i.e., in the length direction of the first support rod 1, so that it is moved to a position corresponding to the first support sub-rod 11 which is used for supporting a glass substrate to be picked and placed; the first connector 5 is controlled by the second moving mechanism to move, so as to realize the control on the movement of the first support sub-rod 11.

The first connector 5 may have a variety of specific structural forms, as long as the first support sub-rod 11 at the first position can be driven to move. In this example, the first connector 5 comprises a first bar-shaped connecting portion 51 provided parallel to the first support rod 1, the first bar-shaped connecting portion 51 is divided into a first portion having first magnetic polarity and a second portion having second magnetic polarity from one end to the other, the first magnetic polarity and the second magnetic polarity repel each other.

One end of the first support sub-rod 11 near the first support rod 1 comprises a second bar-shaped connecting portion 13 provided parallel to the first support rod 1, the second bar-shaped connecting portion 13 is divided into a third portion having the second magnetic polarity and a fourth portion having the first magnetic polarity from one end to the other.

Under the control of the second moving mechanism, the first support sub-rod 11 at the first position is moved away from the second support rod 1', while a position of the first portion corresponds to that of the third portion, and a position of the second portion corresponds to that of the fourth portion.

Under the control of the second moving mechanism, the first support sub-rod 11 at the first position is moved toward the second support rod 1', while the position of the first portion corresponds to that of the fourth portion, and the position of the second portion corresponds to that of the third portion.

As shown in FIG. 3, the first bar-shaped connecting portion 51 is a magnet, with its upper half portion as S pole and its lower half portion as N pole. The second bar-shaped connecting portion 13 is also a magnet, with its upper half portion as N pole and its lower half portion as S pole. The S pole of the first bar-shaped connecting portion corresponds to the N pole of the second bar-shaped connecting portion, and the N pole of the first bar-shaped connecting portion corresponds to the S pole of the second bar-shaped connecting portion. At this moment, through the effect of opposite magnetic poles attract, under the control of the second moving mechanism, the second bar-shaped connecting portion 13 is attracted by the first bar-shaped connecting portion 51 so as to move away from the second support rod 1'. Under the control of the first moving mechanism, the first bar-shaped connecting portion 51 is moved upward or downward for a preset distance so that the S pole of the first bar-shaped connecting portion 51 is corresponded to the S pole of the second bar-shaped connecting portion, or the N pole of the first bar-shaped connecting portion is corresponded to the N pole of the second bar-shaped connecting portion. At this moment, through the effect of similar magnetic poles repel each other and under the control of the second moving mechanism, the first support sub-rod 11 at the first position is moved toward the second support rod 1'.

In another example, the upper half portion of the first bar-shaped connecting portion 51 is an N pole, and the lower half portion thereof is an S pole. The second bar-shaped connecting portion 13 is a magnet, with its upper half portion being an S pole and lower half portion being an N pole. The working principle is the same as the above.

Preferably, when the first support sub-rod 11 at the first position is moved toward or away from the second support sub-rod 11', the distance between the first bar-shaped connecting portion 51 and the second bar-shaped connecting portion 13 is a first preset distance.

The first preset distance does not go beyond the effective magnetic range between the first bar-shaped connecting portion 51 and the second bar-shaped connecting portion 13. The first preset distance is set in such a way that, when the first connector 5 drives the first support sub-rod 11 at the first position to move, the first bar-shaped connecting portion 51 does not contact with the second bar-shaped connecting portion 13, but there is a gap therebetween. Such setting enables the first bar-shaped connecting portion 51 and the second bar-shaped connecting portion 13 to be separated conveniently after the first support sub-rod 11 at the first position is moved to a suitable position, without necessity of setting up a separating process and with no damage to the substrate.

Preferably, the first moving mechanism comprises:
a first screw rod 2 connected to the first support rod 1, the first screw rod 2 is provided parallel to the first support rod 1, and the first connector 5 is provided on the first screw rod 2;
a first driving mechanism 3 provided on one end of the first support rod 1, the first driving mechanism 3 is configured to drive the first screw rod 2 to rotate so as to drive the first connector 5 to move along the direction parallel to the first support rod 1.

In this example, the first driving mechanism 3 is a servo motor.

Figure 5:
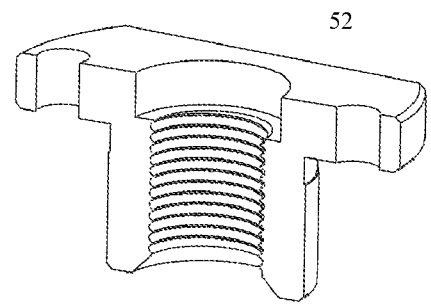
FIG. 5 is a schematic view of the nut having a spiral ball screw groove on its inner circumferential surface according to an embodiment of the present disclosure.
Figure 6:
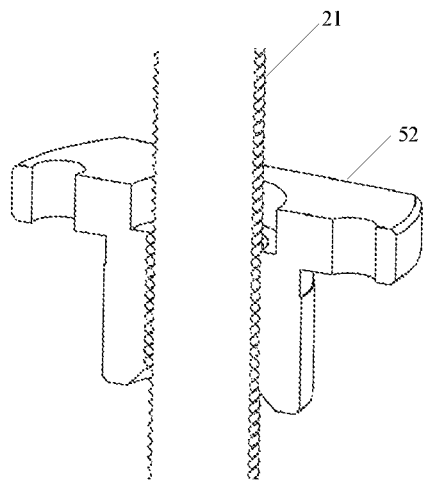
FIG. 6 is a schematic view of the nut in FIG. 5 and a screw shaft that is provided with a spiral ball screw groove on its external surface and matches the nut according to an embodiment of the present disclosure.

As shown in FIGS. 5 and 6, the first screw rod 2 is a ball screw rod, which comprises a screw shaft 21 provided with a spiral ball screw groove on its external surface. The first connector 5 comprises the first bar-shaped connecting portion 51 and a nut 52 connected therewith, the nut 52 has a spiral ball screw groove on its inner circumferential surface which is provided opposite to the ball screw groove of the screw shaft 21, the nut 52 is sleeved onto the screw shaft 21, a spiral ball track formed of the ball screw groove of the nut and the ball screw groove of the screw shaft is provided with a ball, the ball is capable of rolling in the ball track.

The servo motor is operated to drive the screw shaft to rotate so that the motion of the nut is converted into linear motion along with the rotation angle of the screw shaft in accordance with the lead of corresponding specification, and the first bar-shaped connecting portion 51 can be connected to the nut via a nut seat to realize corresponding linear motion, i.e., realizing the movement of the first connector 5 along the direction parallel to the first support rod 1.

Preferably, the second moving mechanism comprises a second driving mechanism 4 connected to the first screw rod 2, the second driving mechanism 4 is configured to drive the first screw rod 2 to move along the direction perpendicular to the first support rod 1 so as to drive the first connector 5 to move along the direction perpendicular to the first support rod 1.

In this example, the second driving mechanism 4 is an air cylinder.

As shown in FIG. 2, the air cylinder can move in a horizontal direction as shown in the figure, i.e., the air cylinder can move in the direction perpendicular to the first support rod 1. The operation of the air cylinder drives the first screw rod 2 to move in the direction perpendicular to the first support rod 1 as a whole.

The second adjusting mechanism may have a variety of specific structural forms, as long as the second support sub-rod 11' of the second support rod 1' at the second position can be controlled to move in the direction perpendicular to the second support rod 1'. In this example, the second adjusting mechanism comprises:
a second connector driving the second support sub-rod 11' at the second position to move through magnetic action;
a third moving mechanism configured to control the second connector to move in a direction parallel to the second support rod 1' so as to choose the second support sub-rod 11' at the second position;
a fourth moving mechanism configured to control the second connector to move in a direction perpendicular to the second support rod 1' so as to drive the second support sub-rod 11' connected to the second connector to move in the direction perpendicular to the second support rod 1'.

The second connector is controlled by the third moving mechanism to move in the direction parallel to the second support rod 1', i.e., in the length direction of the second support rod 1', so that it is moved to a position corresponding to the second support sub-rod 11' which is used for supporting a glass substrate to be picked and placed. The second connector is controlled by the fourth moving mechanism to move so as to realize the control on the movement of the second support sub-rod 11'.

The second connector may have a variety of specific structural forms, as long as the second support sub-rod 11 at the second position can be driven to move. In this example, the second connector comprises a third bar-shaped connecting portion provided parallel to the second support rod 1', the third bar-shaped connecting portion is divided into a fifth portion having third magnetic polarity and a sixth portion having fourth magnetic polarity from one end to the other, the third magnetic polarity and the fourth magnetic polarity repel each other.

One end of the second support sub-rod 11' near the second support rod 1' comprises a fourth bar-shaped connecting portion provided parallel to the second support rod 1', the fourth bar-shaped connecting portion is divided into a seventh portion having the fourth magnetic polarity and an eighth portion having the third magnetic polarity from one end to the other.

Under the control of the fourth moving mechanism, the second support sub-rod 11' at the second position is moved away from the first support rod 1, while the position of the fifth portion corresponds to that of the seventh portion, and the position of the sixth portion corresponds to that of the eighth portion.

Under the control of the fourth moving mechanism, the second support sub-rod 11' at the second position is moved toward the first support rod 1, while the position of the fifth portion corresponds to that of the eighth portion, or the position of the sixth portion corresponds to that of the seventh portion.

The third bar-shaped connecting portion is a magnet, with its upper half portion being an S pole and lower half portion being an N pole. The fourth bar-shaped connecting portion is a magnet, with its upper half portion being an N pole and lower half portion being an S pole. The S pole of the third bar-shaped connecting portion corresponds to the N pole of the fourth bar-shaped connecting portion, and the N pole of the third bar-shaped connecting portion corresponds to the S pole of the fourth bar-shaped connecting portion. At this moment, through the effect of opposite magnetic poles attract, under the control of the fourth moving mechanism, the third bar-shaped connecting portion attracts the fourth bar-shaped connecting portion so as to move away from the first support rod 1; under the control of the third moving mechanism, the third bar-shaped connecting portion moves upward or downward for a preset distance so that the S pole of the third bar-shaped connecting portion is corresponded to the S pole of the fourth bar-shaped connecting portion, or the N pole of the third bar-shaped connecting portion is corresponded to the N pole of the fourth bar-shaped connecting portion. At this moment, through the effect of similar magnetic poles repel each other and under the control of the fourth moving mechanism, the second support sub-rod 11' at the second position is moved toward the first support rod 1.

In another example, the upper half portion of the third bar-shaped connecting portion is an N pole, and the lower half portion thereof is an S pole, while the fourth bar-shaped connecting portion is a magnet, with its upper half portion being an S pole and lower half portion being an N pole. The working principle is the same as the above.

Preferably, when the second support sub-rod 11' at the second position is moved toward or away from the first support rod 1, a distance between the third bar-shaped connecting portion and the fourth bar-shaped connecting portion is a second preset distance.

The second preset distance does not go beyond the effective magnetic range between the third bar-shaped connecting portion and the fourth bar-shaped connecting portion. The second preset distance is set in such a way that, when the second connector drives the second support sub-rod 11' at the second position to move, the third bar-shaped connecting portion does not contact with the fourth bar-shaped connecting portion, but there is a gap therebetween. Such setting enables the third bar-shaped connecting portion and the fourth bar-shaped connecting portion to be separated conveniently after the second support sub-rod 11' at the second position is moved to a suitable position, without necessity of setting up a separating process and without any damage to the substrate.

Preferably, the third moving mechanism comprises:
- a second screw rod connected to the second support rod 1', the second screw rod is provided parallel to the second support rod 1', and the second connector is provided on the second screw rod;
- a third driving mechanism provided on one end of the second support rod 1', the third driving mechanism is configured to drive the second screw rod to rotate so as to drive the second connector to move along the direction parallel to the second support rod 1'.

In this example, the third driving mechanism is a servo motor.

Preferably, the fourth moving mechanism comprises a fourth driving mechanism connected to the second screw rod, the fourth driving mechanism is configured to drive the second screw rod to move along the direction perpendicular to the second support rod 1' so as to drive the second connector to move along the direction perpendicular to the second support rod 1'.

In this example, the fourth driving mechanism is an air cylinder.

Figure 4:
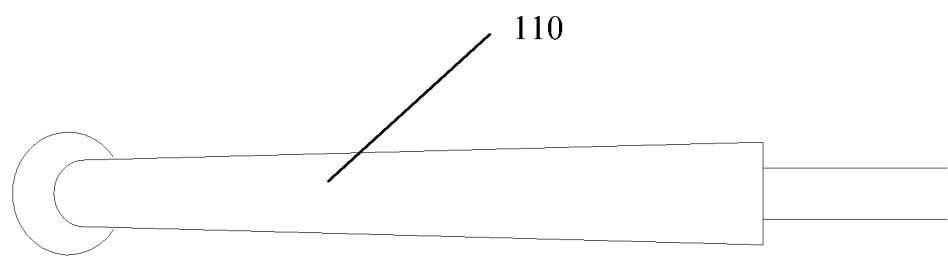
FIG. 4 is a schematic partially enlarged view showing a first support sub-rod according to an embodiment of the present disclosure.

As shown in FIG. 4, preferably, the first support sub-rod 11 comprises thereon a first region 110 for supporting the substrate, the first region is tapered, and one end of the first region near the first support rod 1 has an area larger than that of the other end of the first region away from the first support rod 1.

Preferably, the second support sub-rod 11' comprises thereon a second region for supporting the substrate, the second region is tapered, and one end of the second region near the second support rod 1' has an area larger than that of the other end of the second region away from the second support rod 1'.

The tapered design of the first support sub-rod 11 and the second support sub-rod 11' (wherein the tapered angle thereof can be set according to actual requirements) enables them to be better fitted to corresponding warping part of the substrate, thereby increasing the number of pressure points and reducing generation of stress.

Preferably, one end of the first support sub-rod 11 near the second support rod 1' is provided with a guide wheel 12, and one end of the second support sub-rod 11' near the first support rod 1 is provided with a guide wheel 12.

When placing a glass substrate, it is necessary to enlarge corresponding gap between the first support sub-rod 11 and the second support sub-rod 11', which are used for supporting the glass substrate to be held. After placed the glass substrate, in order to better support the glass substrate, it is necessary to reduce the corresponding gap between the first support sub-rod 11 and the second support sub-rod 11' so that the glass substrate is prevented from sagging. When picking out the glass substrate, it is necessary to firstly enlarge the corresponding gap between the first support sub-rod 11 and the second support sub-rod 11', which are holding the glass substrate, to avoid the occurrence of interference with the robot's fork. Regardless of adjusting the corresponding gap between the first support sub-rod 11 and the second support sub-rod 11' after placing the glass substrate or adjusting the corresponding gap when picking out the glass substrate, the first support sub-rod 11 and/or the second support sub-rod 11' will being moved with respect to the glass substrate. At this moment, the provision of the guide wheel 12 can contribute to corresponding movements of the first support sub-rod 11 and the second support sub-rod 11', thereby reducing the resistance occurred when the first support sub-rod 11 and/or the second support sub-rod 11' move/moves with respect to the glass substrate, and also avoid damage to the substrate during the corresponding movements of the first support sub-rod 11 and the second support sub-rod 11'.

The above description only shows the preferable embodiments of the present disclosure. It should be pointed out that, for one of ordinary skills in the art, many improvements and modifications can be made without departing from the principle of the invention, and all these improvements and modifications shall fall into the scope of the invention.

What is claimed is:

1. A holding apparatus for holding substrates, comprising: a case, and a first support rod and a second support rod which are located on two opposite sides in the case, wherein the first support rod is provided with a plurality of first support sub-rods, and the second support rod is provided with a plurality of second support sub-rods of numbers and at positions corresponding to the first support sub-rods, the first support sub-rods and the second support sub-rods are arranged opposite to each other so as to support the substrates, wherein the holding apparatus for holding substrates further comprises a first adjusting mechanism provided on one side of the first support rod away from the second support rod and configured to control the first support sub-rods of the first support rod at a first position to move in a direction perpendicular to the first support rod, so as to adjust gaps between the first support sub-rods and the second support sub-rods of the second support rod at a second position, wherein the first position corresponds to the second position; and wherein the first adjusting mechanism comprises:

a first connector configured to drive the first support sub-rod at the first position to move through magnetic action;

a first moving mechanism configured to control the first connector to move in a direction parallel to the first support rod, so that a position of the first connector corresponds to that of the first support sub-rod at the first position; and a second moving mechanism configured to control the first connector to move in a direction perpendicular to the first support rod, so as to drive the first support sub-rod connected to the first connector to move in a direction perpendicular to the first support rod.

2. The holding apparatus for holding substrates according to claim 1, further comprising:

a second adjusting mechanism provided on one side of the second support rod away from the first support rod and configured to control the second support sub-rods of the second support rod at the second position to move in a direction perpendicular to the second support rod, so as to adjust gaps between the second support sub-rods and the first support sub-rods of the first support rod at the first position.

3. The holding apparatus for holding substrates according to claim 1, wherein:

the first connector comprises a first bar-shaped connecting portion provided parallel to the first support rod, the first bar-shaped connecting portion is divided into a first portion having first magnetic polarity and a second portion having second magnetic polarity from one end to the other, and the first magnetic polarity and the second magnetic polarity repel each other;

one end of the first support sub-rod near the first support rod comprises a second bar-shaped connecting portion provided parallel to the first support rod, the second bar-shaped connecting portion is divided into a third portion having the second magnetic polarity and a fourth portion having the first magnetic polarity from one end to the other;

under the control of the second moving mechanism, the first support sub-rod at the first position is moved away from the second support rod, while a position of the first portion corresponds to that of the third portion, and a position of the second portion corresponds to that of the fourth portion; and under the control of the second moving mechanism, the first support sub-rod at the first position is moved toward the second support rod, while the position of the first portion corresponds to that of the fourth portion, and the position of the second portion corresponds to that of the third portion.

4. The holding apparatus for holding substrates according to claim 3, wherein when the first support sub-rod at the first position is moved toward or away from the second support rod, a distance between the first bar-shaped connecting portion and the second bar-shaped connecting portion is a first preset distance.

5. The holding apparatus for holding substrates according to claim 1, wherein the first moving mechanism comprises:

a first screw rod connected to the first support rod, wherein the first screw rod is provided parallel to the first support rod, and the first connector is provided on the first screw rod; and a first driving mechanism provided on one end of the first support rod, wherein the first driving mechanism is configured to drive the first screw rod to rotate so as to drive the first connector to move along a direction parallel to the first support rod.

6. The holding apparatus for holding substrates according to claim 5, wherein the first driving mechanism is a servo motor, and the first screw rod is a ball screw rod.

7. The holding apparatus for holding substrates according to claim 6, wherein the ball screw rod comprises a screw shaft provided with a spiral ball screw groove on its external surface; the first connector comprises a first bar-shaped connecting portion and a nut connected therewith, the nut has a spiral ball screw groove on its inner circumferential surface which is provided opposite to the ball screw groove of the screw shaft, the nut is sleeved onto the screw shaft, a ball track formed of the ball screw groove of the nut and the ball screw groove of the screw shaft is provided with a ball, and the ball is capable of rolling in the ball track.

8. The holding apparatus for holding substrates according to claim 5, wherein the second moving mechanism comprises:

a second driving mechanism connected to the first screw rod, and the second driving mechanism is configured to drive the first screw rod to move along a direction perpendicular to the first support rod so as to drive the first connector to move along a direction perpendicular to the first support rod.

9. The holding apparatus for holding substrates according to claim 8, wherein the second driving mechanism is an air cylinder.

10. The holding apparatus for holding substrates according to claim 2, wherein the second adjusting mechanism comprises:

a second connector driving the second support sub-rod at the second position to move through magnetic action;

a third moving mechanism configured to control the second connector to move in a direction parallel to the second support rod so as to choose the second support sub-rod at the second position; and a fourth moving mechanism configured to control the second connector to move in a direction perpendicular to the second support rod so as to drive the second support sub-rod connected to the second connector to move in a direction perpendicular to the second support rod.

11. The holding apparatus for holding substrates according to claim 10, wherein:
- the second connector comprises a third bar-shaped connecting portion provided parallel to the second support rod, the third bar-shaped connecting portion is divided into a fifth portion having third magnetic polarity and a sixth portion having fourth magnetic polarity from one end to the other, and the third magnetic polarity and the fourth magnetic polarity repel each other;
- one end of the second support sub-rod near the second support rod comprises a fourth bar-shaped connecting portion provided parallel to the second support rod, the fourth bar-shaped connecting portion is divided into a seventh portion having the fourth magnetic polarity and an eighth portion having the third magnetic polarity;
- under the control of the fourth moving mechanism, the second support sub-rod at the second position is moved away from the first support rod, while a position of the fifth portion corresponds to that of the seventh portion, and a position of the sixth portion corresponds to that of the eighth portion; and
- under the control of the fourth moving mechanism, the second support sub-rod at the second position is moved toward the first support rod, while the position of the fifth portion corresponds to that of the eighth portion, or the position of the sixth portion corresponds to that of the seventh portion.

12. The holding apparatus for holding substrates according to claim 11, wherein when the second support sub-rod at the second position is moved toward or away from the first support rod, a distance between the third bar-shaped connecting portion and the fourth bar-shaped connecting portion is a second preset distance.

13. The holding apparatus for holding substrates according to claim 11, wherein the third moving mechanism comprises:
- a second screw rod connected to the second support rod, wherein the second screw rod is provided parallel to the second support rod, and the second connector is provided on the second screw rod; and
- a third driving mechanism provided on one end of the second support rod, wherein the third driving mechanism is configured to drive the second screw rod to rotate so as to drive the second connector to move along a direction parallel to the second support rod.

14. The holding apparatus for holding substrates according to claim 13, wherein the third driving mechanism is a servo motor.

15. The holding apparatus for holding substrates according to claim 12, wherein the fourth moving mechanism comprises:
- a fourth driving mechanism connected to a second screw rod, and the fourth driving mechanism is configured to drive the second screw rod to move along a direction perpendicular to the second support rod so as to drive the second connector to move along a direction perpendicular to the second support rod.

16. The holding apparatus for holding substrates according to claim 15, wherein the fourth driving mechanism is an air cylinder.

17. The holding apparatus for holding substrates according to claim 1, wherein the first support sub-rod comprises thereon a first region for supporting the substrate, the first region is tapered, and one end of the first region near the first support rod has an area larger than that of the other end of the first region away from the first support rod.

18. The holding apparatus for holding substrates according to claim 1, wherein the second support sub-rod comprises thereon a second region for supporting the substrate, the second region is tapered, and one end of the second region near the second support rod has an area larger than that of the other end of the second region away from the second support rod.

19. The holding apparatus for holding substrates according to claim 1, wherein one end of the first support sub-rod near the second support rod is provided with a guide wheel, and one end of the second support sub-rod near the first support rod is provided with a guide wheel.

* * * * *